(12) United States Patent
Kovalev

(10) Patent No.: US 12,716,945 B2
(45) Date of Patent: Aug. 25, 2026

(54) SECURE SCAN TESTING OF INTEGRATED CIRCUITS

(71) Applicant: SK hynix Inc., Gyeonggi-do (KR)

(72) Inventor: Vladimir Valentinovich Kovalev, Hayward, CA (US)

(73) Assignee: SK hynix Inc., Gyeonggi-do (KR)

( * ) Notice: Subject to any disclaimer, the term of this patent is extended or adjusted under 35 U.S.C. 154(b) by 78 days.

(21) Appl. No.: 18/959,204

(22) Filed: Nov. 25, 2024

(65) Prior Publication Data

US 2026/0147041 A1 May 28, 2026

(51) Int. Cl.
*G01R 31/3185* (2006.01)
*G01R 31/317* (2006.01)

(52) U.S. Cl.
CPC ................ *G01R 31/318588* (2013.01); *G01R 31/31719* (2013.01); *G01R 31/318541* (2013.01); *G01R 31/31855* (2013.01); *G01R 31/318572* (2013.01)

(58) Field of Classification Search
CPC ...... G01R 31/318588; G01R 31/31719; G01R 31/318541; G01R 31/31855; G01R 31/318572
See application file for complete search history.

(56) References Cited

U.S. PATENT DOCUMENTS

| | | | | |
|---|---|---|---|---|
| 8,626,460 | B2 | 1/2014 | Kaufman et al. | |
| 9,081,932 | B2 | 7/2015 | Liao et al. | |
| 9,390,291 | B2 | 7/2016 | Cox et al. | |
| 9,927,490 | B2 | 3/2018 | Hao et al. | |
| 10,102,500 | B2 | 10/2018 | Fung et al. | |
| 10,742,405 | B2 | 8/2020 | Hars | |
| 11,320,482 | B2 | 5/2022 | Srivastava et al. | |
| 11,728,328 | B2 | 8/2023 | Tucker | |
| 11,927,633 | B1 | 3/2024 | Kawoosa et al. | |
| 2014/0157066 | A1* | 6/2014 | Johnson | G11C 29/40 714/719 |
| 2022/0246184 | A1* | 8/2022 | Bhatia | G11C 7/20 |
| 2023/0375617 | A1* | 11/2023 | Jain | G01R 31/31853 |

OTHER PUBLICATIONS

Leonhard, J., et al., "Digitally-Assisted Mixed-Signal Circuit Security," Final Manuscript accepted by *IEEE Transactions on Computer-Aided Design of Integrated Circuits and Systems*, HAL Open Science, Sep. 2021, 15 pages, URL: https://hal.science/hal-03337109v1.

* cited by examiner

*Primary Examiner* — Thien Nguyen
(74) *Attorney, Agent, or Firm* — Weaver Austin Villeneuve & Sampson LLP

(57) ABSTRACT

Techniques for scan testing integrated circuits that process sensitive data while protecting such data from unauthorized access. A second scan register is provided in parallel to a primary scan register, the second scan register functionally replicating the primary scan register. The primary and replica scan registers are scan loadable (i.e., can be loaded with scan data) but are non-scannable (i.e., not scan readable). Instead of data captured by the first and second scan registers being scanned out for external observation, contents of the first and second scan registers are compared, and the comparison result is captured by a third scan register that operates as a regular scannable (or scan readable) register. The values of the third scan register scanned out for observation reflect the test results, and data in the first and second scan registers are not scanned out and cannot be observed.

20 Claims, 5 Drawing Sheets

SECURE SCAN TESTING OF INTEGRATED CIRCUITS

BACKGROUND

In the semiconductor industry, scan testing is used during the manufacturing process to detect structural defects in a fabricated integrated circuit. Scan testing typically involves scanning test patterns into internal circuitry within the device under test. The test pattern is shifted into the scan register and excites the circuit, and the results are captured and scanned out to detect whether they match the expected outcome. A mismatch between the scanned output and the expected result indicates existence of defects in the internal circuitry. In applications where an integrated circuit processes sensitive data, scan testing may compromise the security of such data since it involves accessing the internal circuitry of the device. A typical approach to protecting sensitive data is to use scan isolation techniques whereby those parts of the circuit that store and process sensitive data are excluded from scan testing. Sensitive data is masked or hidden during scanning out operations in manufacturing or unauthorized access stages. This type of scan isolation technique, however, reduces the test coverage for the device and may result in an increase in the rate of customer returns due to faulty products. Attempts have been made to protect sensitive data during scan testing operation by providing an external key, a specific pattern of data that is externally supplied and must be matched by the internal circuitry before data is allowed to be scanned out. Such key based security techniques, however, tend to have limited applicability in the scan testing context which can, for larger more complex integrated circuits, involve hundreds of thousands of test patterns, each of which would require an externally provided key. There is therefore a need for scan testing technology that efficiently provides coverage for circuitry that process sensitive data without compromising the security of such data.

BRIEF SUMMARY

Implementations are described herein for scan testing technology that efficiently and securely tests circuitries that process sensitive data while protecting such data from unauthorized access. In one implementation, for those parts of the integrated circuit that process sensitive data, a second scan register is provided in parallel to a primary scan register. The second scan register functionally substantially replicates the primary scan register. The primary and the second scan registers, referred to herein as first and second source scan registers, respectively, are scan loadable (i.e., can be loaded with scan data supplied by external test equipment) but are non-scannable (i.e., not scan readable). The terms “scannable” or “scan readable” as used herein refer to the ability to scan out values stored in the register for observation by the external test equipment. There is also provided a third scan register that operates as a regular scannable (or scan readable) register, referred to herein as target scan register. The target scan register is preferably associated with a part of the circuit that either does not process sensitive data or processes data that does not require the same level of security.

During scan testing operation, test pattern supplied by the test equipment is loaded into the two non-scannable source scan registers, and the target scan register is loaded and unloaded as a regular scan register. During a capture cycle, functional data responsive to the test data is captured by the first and second source scan registers. A compare circuit implements a bitwise comparison of the contents of the first and second non-scannable source scan registers and supplies its output to the target register. Since the first and second non-scannable source scan registers are substantially functionally equivalent and are loaded with the same data, the output of the compare circuit is expected to indicate identical contents. For example, if the comparison circuit performs a bitwise exclusive OR (XOR) function, given no defects are present in the first and second non-scannable source scan registers, the expected output as captured by the target scan register would be all 0’s. Accordingly, the values of the target scan register scanned out to the test equipment reflect the test results, but data in the two source scan registers are not scanned out and cannot be observed, thereby remaining protected. Further, the second source scan register that substantially functionally replicates the first source scan register may be configured to provide for redundancy during normal functional operation.

In one specific implementation, a method is provided for secure scan testing of an integrated circuit, the method includes the steps of: receiving a first test pattern; loading the first test pattern into a first scan register and a second scan register, the second scan register substantially functionally replicating the first scan register; applying the loaded test pattern to circuitry activating functionality of the circuitry; capturing response of the circuitry in the first scan register and the second scan register; comparing contents of the first scan register with contents of the second scan register on a bit by bit basis to generate a compare result; capturing the compare result in a third scan register; and scanning out contents of the third scan register for observation by test equipment, wherein the contents of the first scan register and the second scan register are not scanned out, thereby remaining secure.

In another specific implementation, an integrated circuit includes logic circuitry having a first plurality of data holding units, the first plurality of data holding units configured as a first secure scan register and coupled to receive, in a first cycle, a first test pattern, and to receive, in a second cycle, responses to the test pattern from the logic circuitry. The integrated circuit further includes a second plurality of data holding units configured as a second secure scan register substantially functionally replicating the first secure scan register. A compare circuit is coupled to the first secure scan register and the second secure scan register. The compare circuit is configured to compare a bit from the first secure scan register to a corresponding bit from the second secure scan register and generate a result of the comparison. The integrated circuit further includes a third scan register having an input coupled to the compare circuit and an output, the third scan register configured to receive the result of the comparison and to scan out its content at the output, wherein the responses from the circuitry in the first secure scan register and the second secure scan register are not scanned out and remain secure.

A fuller understanding of the inventive technology can be gained by reference to the following detailed description and the exemplary figures.

BRIEF DESCRIPTION OF THE DRAWINGS

Various embodiments in accordance with the present disclosure will be described with reference to the drawings, in which.

DETAILED DESCRIPTION

Figure 1:
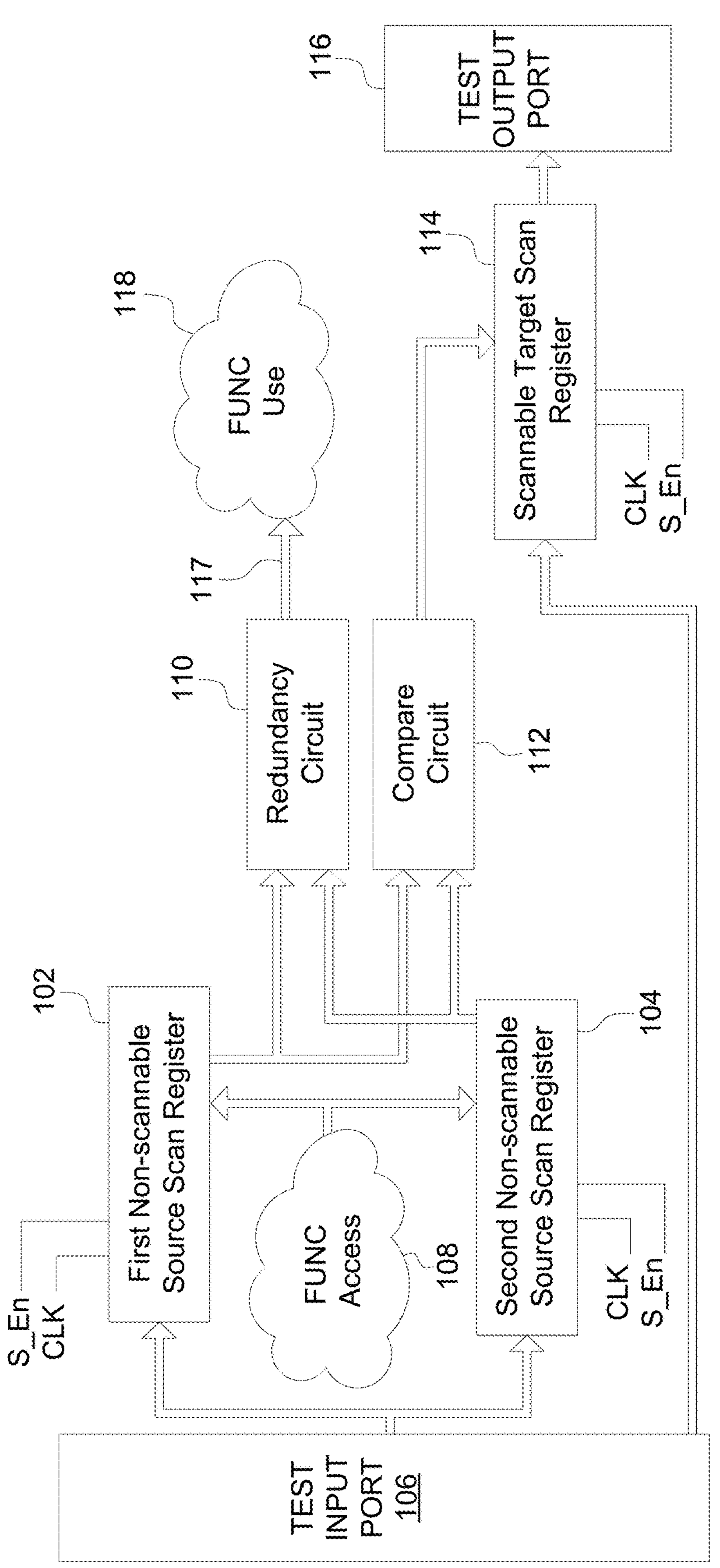
FIG. 1 illustrates a block diagram of an exemplary secure scan test architecture.

FIG. 1 is a block diagram of an exemplary integrated circuit 100 implementing a scan testing architecture that can protect and maintain security of sensitive data. Integrated circuit 100 includes a first source scan register 102 and a second source scan register 104. First source scan register 102 is made up of a plurality of data holding units from integrated circuit 100 that, during normal functional operation, perform their intended function but are modified to allow for scan testing of the circuit during test mode. A data holding unit, as used herein, refers to any unit of circuitry that can hold data such as a flip flop or a latch. The modified data holding units, also referred to herein as scan cells, are serially coupled together to form first source scan register 102 that may operate as a shift register during test mode. An exemplary implementation of a scan register including such modified data holding units is described below in connection with FIG. 2. First source scan register 102 has a first input coupled to a test input port 106, a second input coupled to receive a clock signal CLK, a third input coupled to receive a shift enable signal S_En, a fourth input coupled to FUNC Access 108, and an output coupled to an input of a redundancy circuit 110. Second source scan register 104 is configured to substantially replicate first source scan register 102 in terms of its functionality as well as its resources (including scan cells) and circuit connections, as shown in FIG. 1. Redundancy circuit 110 has an output 117 coupled to FUNC Use 118. FUNC Access 108 is a part of the core circuitry from which data is written into source scan registers. FUNC Use 118 is a part of the same core circuitry that reads and uses data from source scan registers. Integrated circuit 100 further includes a compare circuit 112 which has a first input coupled to the output of first source scan register 102, and a second input coupled to the output of second source scan register 104. Compare circuit 112 compares the data it receives at its inputs against each other and generates an output. The output of compare circuit 112 couples to a first input of a target scan register 114. Target scan register 114 has a second input that couples to test input port 106, and an output that couples to test output port 116. Target scan register 114 also receives a clock input CLK and a shift enable input S_En. Test input port 106 and test output port 116 may be implemented as part of a combined test I/O port.

According to this implementation, there is a distinction between source scan registers 102/104 and target scan register 114. Specifically, unlike target scan register 114, the outputs of source scan registers 102 and 104 are not coupled to test output port 116, and therefore their content cannot be scanned outside integrated circuit 100, i.e., the source scan registers are not scan readable. Target scan register 114, on the other hand, is both scan loadable and scan readable as in regular scan registers. The second input of target scan register 114 that couples to test input port 106 may be configured to couple to a regular scan input S_In_r, while the first input of source scan registers 102/104 that couples to test input port 106, may be configured to couple to any other scan input S_In_a. The coupling of the second input of target scan register 114 to a regular scan input S_In_r may be done automatically by scan test tools. The coupling of the first input of source scan registers 102 and 104 to any other scan input S_In_a may be done by a circuit designer.

Figure 2:
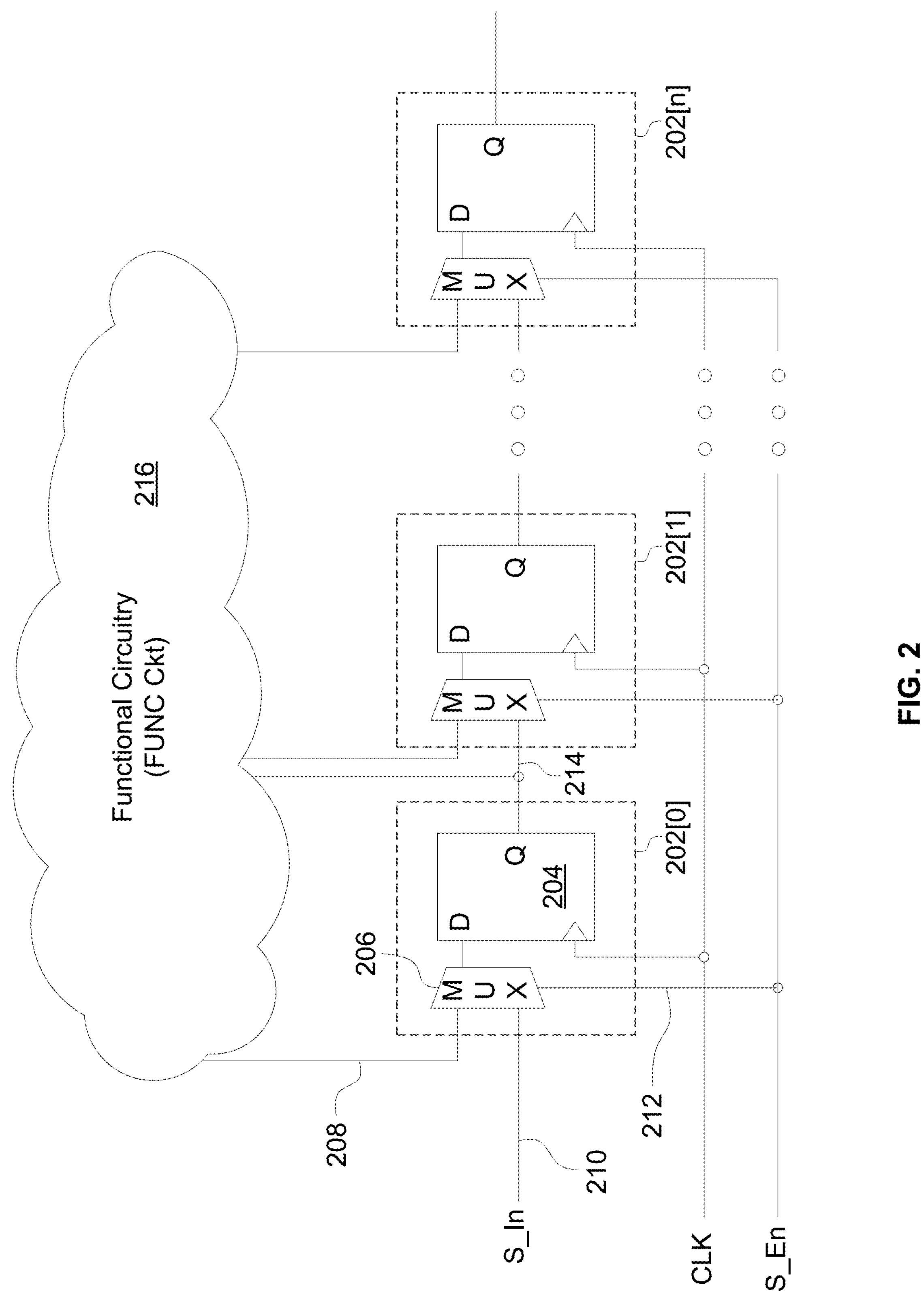
FIG. 2 is a schematic for an exemplary scan register including data holding units.

An exemplary implementation for a scan register 200 is depicted in FIG. 2. Scan register 200 includes a plurality of data holding units, or scan cells, 202[0] to **202[*n*] coupled in series. An example of a data holding unit 202 may be a flip flop circuit that is modified to operate as a scan cell in a scan register. Each scan cell 202 includes a flip flop 204 and a multiplexer 206. Multiplexer 206 has one input coupled to a data input 208 of scan cell 202 and another input coupled to a scan input 210 of scan cell 202. An output of multiplexer 206 couples to a D input of flip flop 204. A select input 212 of multiplexer 206 is coupled to receive the shift enable signal S_En. Flip flop 204 also has an input coupled to receive the clock signal CLK and has an output coupled to the output 214 of scan cell 202. Scan input 210 of the first scan cell 202[0] forms the input to scan register 200, while the output of scan cell 202[0] couples to the input of the succeeding scan cell 202[1], and this serial coupling carries through to the final scan cell 202[*n*]. Data input 208 of each scan cell 202 couples to functional circuitry FUNC Ckt 216. In addition to coupling to the scan input of the next scan cell, output 214 of each scan cell also couples to FUNC Ckt 216**.

The operation of integrated circuit 100 of FIG. 1 implementing secure scan testing will be described hereinafter with reference to the phase diagram of FIG. 3 and flow diagram of FIG. 4. During normal functional mode of operation, shift enable signal S_En is inactive, e.g., at a logic low level. A logic low level applied to select input 212 of multiplexer 206 couples data input 208 to the D input of flip flop 204 in each scan cell 202, and scan cells 202 in the scan registers perform their intended function as part of the core circuitry. When the device enters scan mode, scan test operation begins by the shift enable signal S_En going HIGH, step 402 in FIG. 4, coupling, via multiplexer 206, scan input 210 in each scan cell 202 to the D input of the scan cell flip flop 204. This allows scan registers 102, 104 and 114 to start receiving and shifting test data from input port 106. Test patterns are generated by an automatic test pattern generation (ATPG) tool that supplies a test pattern to input port 106. If this is the very first test pattern being applied at the start of the scan operation (step 404), the test pattern, which may be a pseudo-random pattern of 1's and 0's, is loaded into the scan registers, and in response to the CLK signal is shifted across the cells 202 through the scan registers (step 406). Source scan registers 102 and 104 are loaded by the ATPG tool via test input port 106, and S_In_a, and target scan registers are loaded by the ATPG tool via S_In_r and unloaded by the ATPG tool via test output port 116.

Once source scan registers 102 and 104 are fully loaded with the test pattern, data at their outputs go through redundancy circuit 110 and are captured by functional flip flops in FUNC Use 118. The purpose of redundancy circuit 110 is to take advantage of the provision of second source scan register 104 which replicates first source scan register 102 and can therefore be utilized as redundant circuitry. That is, should there be a defect in first source scan register 102, such as a "single bit stuck at zero," replica second source scan register 104 can provide a functional substitute. Redundancy circuit 110 may accomplish this by, for example, performing a bitwise OR logic function between the contents of first and second source scan registers 102 and 104. While the inclusion of redundancy circuit 110 improves the robustness of integrated circuit 100, it is an optional feature and is not required for implementing the secure scan testing architecture.

Referring back to FIGS. 3 and 4, at step 408, shift enable signal S_En goes LOW to start the capture phase (step 410) of the scan test operation. When shift enable signal S_En is LOW, at step 410, multiplexer 206 and flip flop 204 in each scan cell 202 within first source scan register 102 and second source scan register 104 are configured to capture new functional data. Target scan register 114 captures the output of compare circuit 112. The function of compare circuit 112 is to perform a bitwise comparison of the contents of first source scan register 102 with the contents of second source scan register 104. This can be implemented by, for example, a bitwise XOR logic circuit. Because second source scan register 104 functionally replicates first source scan register 102, the expected output of compare circuit 112 which performs a bitwise XOR function, would be all 0's if there are no defects. During the capture phase (step 410), target scan register 114 captures the output of compare circuit 112, which represents the XOR values of the previous contents of source scan registers (i.e., XOR values of data loaded into source scan registers before the source scan registers captured new functional data). As described above, unlike source scan registers 102 and 104 which are not scan readable, target scan register 114 is scan readable, and its contents are accessed via test output port 116.

After the completion of the capture phase for the first test pattern, the process repeats for the next pattern with shift enable going HIGH (back to step 402). During this subsequent shift cycle, any defects can be detected and logged (step 412). And the shift and capture cycles continue until the last test pattern has been processed.

Figure 3:
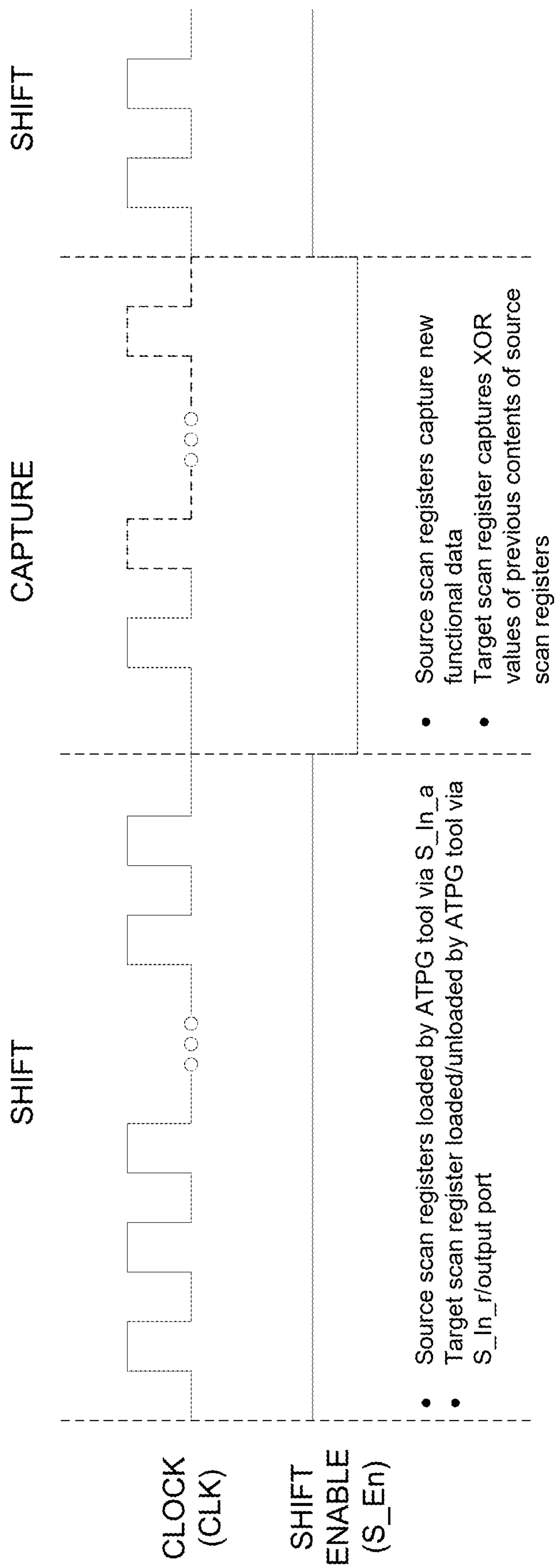
FIG. 3 is a phase diagram illustrating the cycles of an exemplary secure scan testing operation.
Figure 4:
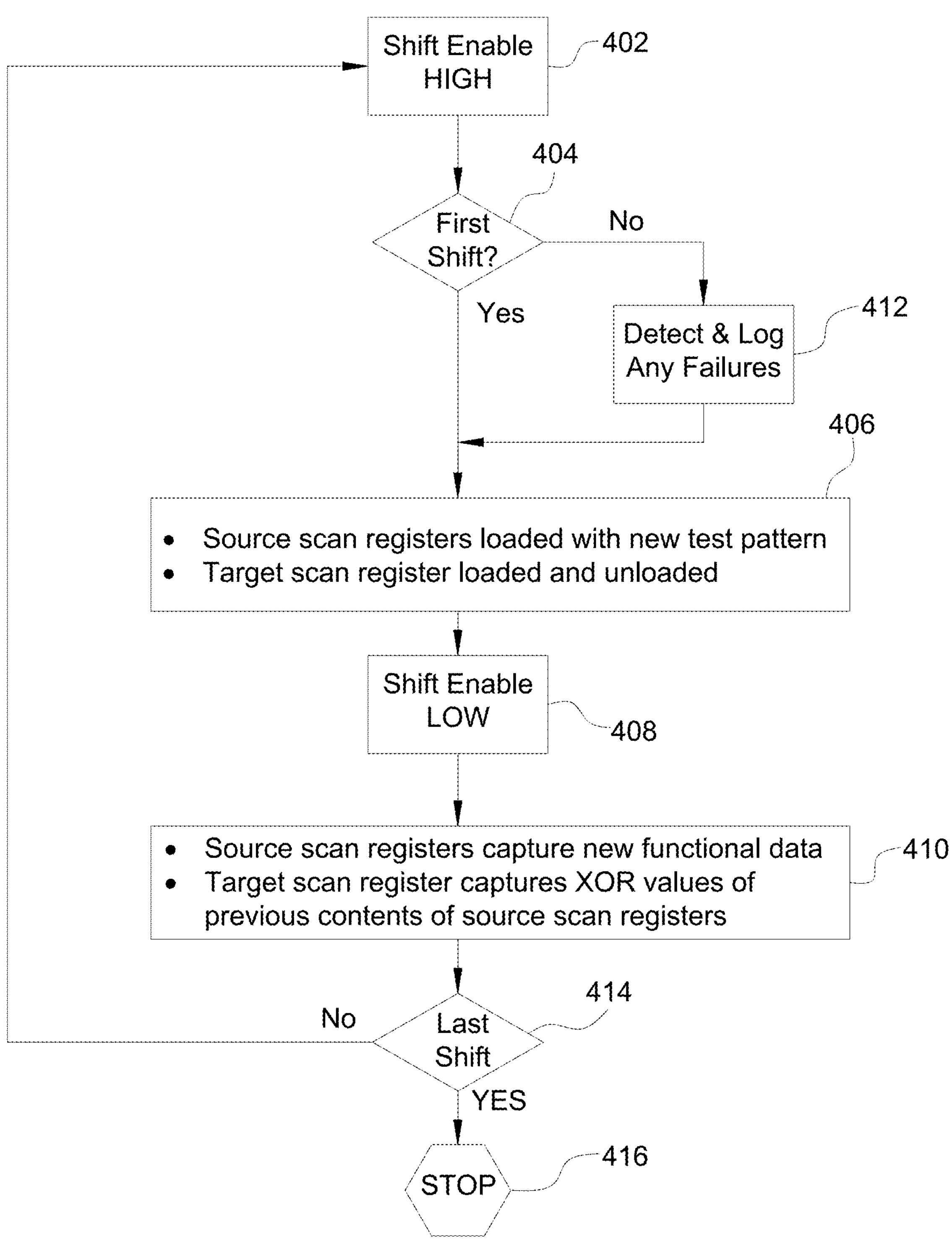
FIG. 4 is a flow diagram illustrating the operation of the secure scan testing technology.

The embodiment described thus far envisions a capture cycle with a single clock pulse as shown with the solid pulse in FIG. 3. In an alternative embodiment, it is possible to conduct scan testing that employs more than one clock pulse during the capture cycle, for example, to facilitate a sequential mode of scan testing. The dashed clock pulses in the capture cycle as shown in FIG. 3 represent such a sequential scan testing embodiment. In this embodiment, a second clock capture pulse following a first may allow sensitive data captured by first source scan register 102 and second source scan register 104 from a prior shift, to be captured by scan cells from another non-secure scan register associated with FUNC Use 118, which could then be shifted out for external observation. Additional measures can be taken to prevent exposure of sensitive data under such circumstances.

Figure 5:
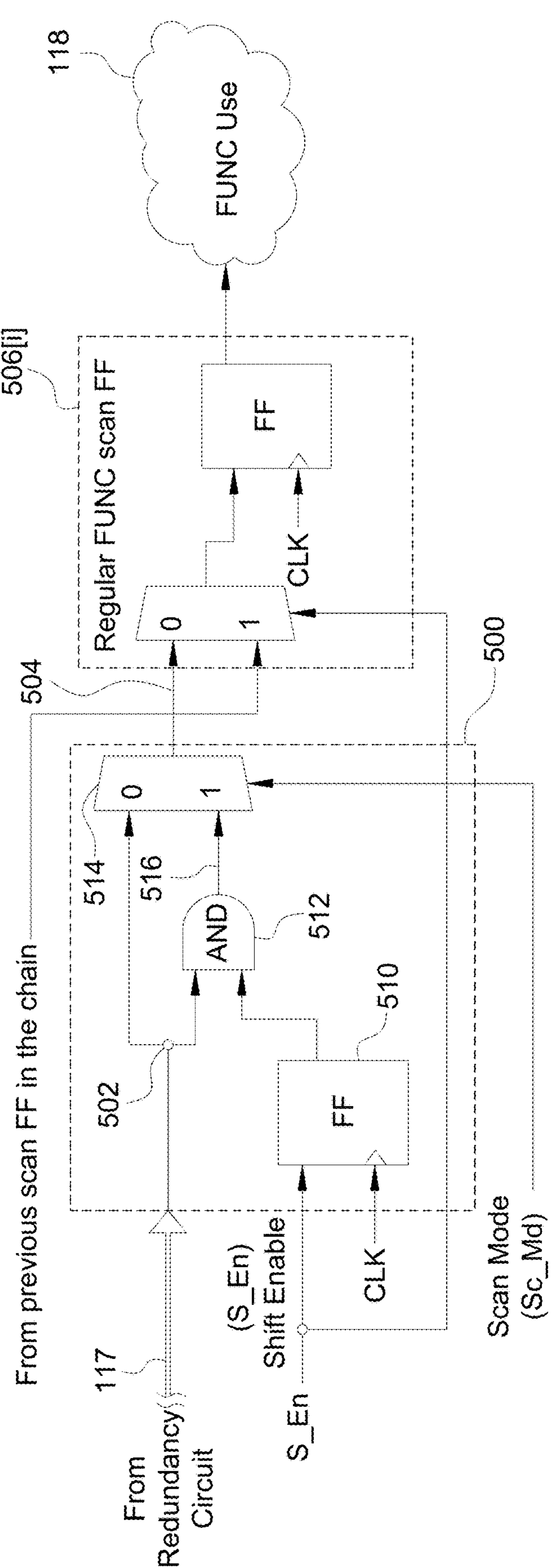
FIG. 5 illustrates an alternative implementation for secure scan test architecture.

In order to protect sensitive data that is captured by secure source registers 102 and 104 from getting exposed via non-secure scan cells in a regular scan register associated with FUNC Use 118 during a subsequent clock capture pulse, a filter or blocking circuit can be inserted between the output 117 of redundancy circuit 110 and FUNC Use 118, that allows data from the first clock capture pulse to be applied to FUNC Use 118 but blocks data from any subsequent clock capture pulses. A simplified exemplary circuit for such a filter is shown in FIG. 5. Referring to FIG. 5, a filter 500 receives output 117 of redundancy circuit 110 (of FIG. 2) at an input 502. An output 504 of filter 500 may be coupled to a data input of a scan cell 506[*i*] in a regular non-secure scan register (not shown) that is coupled to FUNC Use 118. Scan cell 506[*i*] receives the scan output of a preceding scan cell at its scan input. Filter 500 includes a data holding unit, such as a flip flop (FF) 510, having its data input coupled to shift enable signal S_En and a clock input coupled to CLK. An AND gate 512 receives the output of flip flop 510 at one input and output 117 of redundancy circuit 110 at another input. A multiplexer 514 receives the output of AND gate 512 at one input and output 117 of redundancy circuit 110 at another input. A control or select input of multiplexer 514 is coupled to a scan mode signal Sc_Md that indicates whether the device is operating in scan testing mode or regular functional (non-scan) mode of operation. An output of multiplexer 514 couples to output 504 of the filter 500.

In operation, and with reference to both FIG. 5 and FIG. 3, when the device is operating in regular functional mode and not in scan testing mode, signal Sc_Md is at a logic low level. For as long as a logic low level is applied to the select input of multiplexer 514, multiplexer 514 couples data from redundancy circuit 110 arriving at input 502 to output 504 of filter 500. When Sc_Md signal is HIGH and the device is in scan testing mode, multiplexer 514 couples the output of AND gate 512 at its other input (node 516) to output 504 of filter 500. In scan testing mode, during the shift cycle when shift enable signal S_En remains HIGH, flip flop 510 generates a logic high level at its output. With a logic high level at one input, AND gate 512 passes through data from redundancy circuit 110 at its other input, to multiplexer 514 at node 516. And with its control (or select) input at a logic high level (Sc_Md=HIGH), multiplexer 514 allows data from redundancy circuit 110 to pass through. When shift enable signal S_En goes LOW and the capture cycle begins, the first clock pulse will result in the data already shifted to be captured. But the first clock pulse will also result in the output of flip flop 510 in filter 500 to going LOW since S_En at its D input is LOW. This applies a logic low level to one input of AND gate 512 which then masks data on its other input (node 502) from redundancy circuit 110. Therefore, data from any subsequent clock pulse during the capture cycle will be filtered and not captured by any other regular non-secure scan register.

According to secure scan testing architecture described herein, during scan test mode, between the three scan registers 102, 104 and 114, only contents of target scan register 114 will be scanned out and, given no defects, will always hold 0's, and no actual values of source registers will be accessible. The technology described herein also makes provisions to maintain security of sensitive data captured by secure source registers 102 and 104 in the case of a capture cycle that includes multiple consecutive clock pulses. The contents of source registers will remain secure at all times. For example, if flips flops are used in functional circuitry to hold sensitive values such as boot code that may be stored in a ROM, this architecture, including first and second non-scannable source scan registers 102 and 104 that are not externally accessible, can be utilized for scan testing to detect any defects in the integrated circuit. This secure scan testing architecture allows for scan testing sensitive parts of the circuit which may have otherwise been excluded from testing and therefore safely increases the test coverage of the device.

Various embodiments of the present disclosure can be implemented in the form of logic in software or hardware or a combination of both. The logic may be stored in a computer-readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure.

Based on the disclosure and teachings provided herein, a person of ordinary skill in the art will appreciate other ways and/or methods to implement the present disclosure.

The methodology described herein may be partially or fully implemented by code stored on a computer-readable storage medium and/or a hardware module and/or hardware apparatus. A computer-readable storage medium includes, but is not limited to, volatile memory, non-volatile memory, and magnetic and optical storage devices, such as disk drives, magnetic tape, CDs, DVDs, or other media, now known or later developed, that are capable of storing code and/or data. Hardware modules or apparatuses described herein include, but are not limited to, ASICs, FPGAs, dedicated or shared processors, and/or other hardware modules or apparatuses now known or later developed.

The circuitry, methods and processes described herein may be partially or fully embodied as code and/or data stored in a computer-readable storage medium or device, so that when a computer system reads and executes the code and/or data, the computer system performs the associated methods and process.

What is claimed is:

1. A method for secure scan testing an integrated circuit comprising:

receiving a first test pattern;

loading the first test pattern into a first non-scannable scan register and a second non-scannable scan register, the second non-scannable scan register substantially functionally replicating the first non-scannable scan register;

activating a part of the integrated circuit associated with the first non-scannable scan register in response to the loaded first test pattern;

capturing a response of the part of the integrated circuit associated with the first non-scannable scan register in the first non-scannable scan register and the second non-scannable scan register;

comparing contents of the first non-scannable scan register with contents of the second non-scannable scan register to generate a compare result;

capturing the compare result in a scannable scan register; and scanning out contents of the scannable scan register for observation by test equipment, wherein contents of the first non-scannable scan register and the second non-scannable scan register are not scanned out, thereby remaining secure.

2. The method of claim 1, wherein the step of loading the test pattern comprises shifting bits of test data across the first and second non-scannable scan registers.

3. The method of claim 2, wherein the step of comparing comprises comparing each bit of the first non-scannable scan register with a corresponding bit of the second non-scannable scan register.

4. The method of claim 3, wherein the step of comparing comprises performing an exclusive OR (XOR) logic function between each bit of the first non-scannable scan register with a corresponding bit of the second non-scannable scan register.

5. The method of claim 1, further comprising utilizing, in a regular function mode of operation of the integrated circuit, the second non-scannable scan register as a redundant register to the first non-scannable scan register.

6. The method of claim 5, wherein the step of utilizing comprises combining contents of the first non-scannable scan register and the second non-scannable scan register in a bitwise fashion to generate a combined output.

7. The method of claim 6, wherein the step of combining comprises performing a bitwise logic OR function between the contents of the first non-scannable scan register and the contents of the second non-scannable scan register.

8. The method of claim 1, further comprising repeating all the steps with a second test pattern that is different from the first test pattern.

9. An integrated circuit comprising:

circuitry configured to perform logic functions;

a first non-scannable scan register associated with the circuitry and configured to receive, in a first cycle, a test pattern at an input, and to receive, in a second cycle, responses to the test pattern from the circuitry;

a second non-scannable scan register substantially functionally replicating the first non-scannable scan register, associated with the circuitry and configured to receive, in the first cycle, the test pattern at an input, and to receive, in the second cycle, the responses to the test pattern from the circuitry;

a compare circuit coupled to the first non-scannable scan register and the second non-scannable scan register, the compare circuit configured to:

compare a data bit from the first non-scannable scan register to a corresponding data bit from the second non-scannable scan register, and generate a result of the comparison; and a scannable scan register having an input coupled to the compare circuit and an output, the scannable scan configured to receive the result of the comparison and to scan out its content at the output, wherein contents of the first non-scannable scan register and the second non-scannable scan register are not scanned out and remain secure.

10. The integrated circuit of claim 9, wherein the compare circuit is configured to perform a bitwise exclusive OR (XOR) logic function between the contents of the first non-scannable scan register and contents of the second non-scannable scan register.

11. The integrated circuit of claim 9, further comprising:

a redundancy circuit having a first input coupled to the first non-scannable scan register and a second input coupled to the second non-scannable scan register; and an output.

12. The integrated circuit of claim 11, wherein the redundancy circuit comprises a bitwise OR logic circuit that generates at the output a bitwise OR combination of the contents of the first non-scannable scan register and the contents of the second non-scannable scan register.

13. The integrated circuit of claim 11, further comprising a filter circuit coupled to the output of the redundancy circuit, the filter circuit being configured to block access to the contents of the first and second non-scannable scan registers by any other scannable scan register.

14. The integrated circuit of claim 13, wherein the filter circuit comprises a logic gate coupled to a select circuit, configured to allow data from the output of the redundancy circuit to pass through to the circuitry in a first mode and to block data from the output of the redundancy circuit in a second mode.

15. The integrated circuit of claim 9, wherein each of the first non-scannable scan register, the second non-scannable scan register and the scannable scan register comprises a plurality of serially coupled scan cells.

16. The integrated circuit of claim 15, wherein each scan cell comprises a select circuit coupled to a data holding unit.

17. The integrated circuit of claim 16, wherein the select circuit selects between a scan input and a data input in response to a select signal.

18. The integrated circuit of claim 17, wherein the data holding unit is a flip flop having a data input coupled to an output of the select circuit, and a clock input coupled to a clock signal.

19. The integrated circuit of claim 9, wherein the scannable scan register further comprises a regular scan input and may be configured to operate as a regular scannable scan register.

20. The integrated circuit of claim 19, further comprising a test I/O port that couples to the first and second non-scannable scan registers, the second non-scannable scan register and the scannable scan register.

* * * * *